(12) United States Patent
Norris

(10) Patent No.: US 6,780,242 B2
(45) Date of Patent: Aug. 24, 2004

(54) METHOD FOR MANUFACTURING HIGH-QUALITY MANGANESE-DOPED SEMICONDUCTOR NANOCRYSTALS

(75) Inventor: David J. Norris, Princeton, NJ (US)

(73) Assignee: NEC Laboratories America, Inc., Princeton, NJ (US)

(*) Notice: Subject to any disclaimer, the term of this patent is extended or adjusted under 35 U.S.C. 154(b) by 688 days.

(21) Appl. No.: 09/811,674

(22) Filed: Mar. 20, 2001

(65) Prior Publication Data

US 2002/0011564 A1 Jan. 31, 2002

Related U.S. Application Data

(60) Provisional application No. 60/220,911, filed on Jul. 26, 2000.

(51) Int. Cl.[7] .............................................. C30B 25/00
(52) U.S. Cl. ........................... 117/104; 117/68; 117/70; 117/89
(58) Field of Search .............................. 117/104, 89, 68, 117/70

(56) References Cited

U.S. PATENT DOCUMENTS

| | | | | |
|---|---|---|---|---|
| 5,422,907 A | * | 6/1995 | Bhargava | ..................... 372/68 |
| 5,455,489 A | * | 10/1995 | Bhargava | ................. 315/169.4 |
| 5,656,815 A | * | 8/1997 | Justus et al. | ................ 250/337 |
| 6,241,819 B1 | * | 6/2001 | Bhargava et al. | ............. 117/68 |
| 6,309,701 B1 | * | 10/2001 | Barbera-Guillem | ...... 427/213.3 |

OTHER PUBLICATIONS

Murase et al. "Fluorscene and EPR characteristics of Mn dope ZnS nanocrystals prepared by aqueous colloidal method", J. Phys Cem B vol 103 1999 pp. 754–760.*

Mikulec et al.' "Organometallic synthesis and spectroscopic characterization of Manganese–doped CdSe Nanocrystals"' J. Am Chem Soc. vol 122 2000 pp. 2532–2540.*

* cited by examiner

Primary Examiner—Robert Kunemund

(57) ABSTRACT

A method for manufacturing high-quality Mn-doped nanocrystals is provided. The method generally comprises the steps of: (a) combining an organometallic manganese precursor with an organometallic Group II precursor and an organometallic Group VI precursor to provide a precursor mixture; (b) diluting the precursor mixture with a dilution solvent to provide an injection mixture; (c) heating a coordinating solvent; (d) stirring the heated coordinating solvent; and (e) injecting the injection mixture into the heated coordinating solvent while the heated coordinating solvent is being stirred. The invention is particularly useful for manufacturing high-quality, Mn-doped zinc selenide (ZnSe) nanocrystals, high-quality, Mn-doped zinc sulfide (ZnS) nanocrystals, and high-quality, Mn-doped zinc telluride (ZnTe) nanocrystals.

32 Claims, 8 Drawing Sheets

METHOD FOR MANUFACTURING HIGH-QUALITY MANGANESE-DOPED SEMICONDUCTOR NANOCRYSTALS

CROSS-REFERENCE TO RELATED APPLICATION

This application claims the benefit of U.S. Provisional Application No. 60/220,911 filed Jul. 26, 2000.

FIELD OF THE INVENTION

The present invention is directed to the field of materials fabrication, and in particular to the preparation of nanometer-sized particles that are intentionally doped with a low concentration of manganese (Mn) impurities. These materials have applications, among others, as phosphors, laser materials, fluorescent labels for biological assaying, magnetic memory, and in "spintronics."

BACKGROUND OF THE INVENTION

As a result of research over the last ten years, it is now possible to synthesize extremely high-quality colloidal nanometer-scale particles from a wide variety of materials. "Nanometer-scale" as used herein refers to particles that have diameters on a scale of approximately $10^{-9}$ meters (1 nanometer (nm) equals $1 \times 10^{-9}$ meters). "Colloidal" refers to particles that after preparation are easily dispersed in a suitable solvent or carrier material. For many materials it is possible to synthesize a specific desired particle size in the nanometer-scale regime. This ability is important since many of the properties of these particles, also called "nanocrystals," are strongly dependent on the exact size of the particle.

The first method to produce high-quality semiconductor nanocrystals was that of C. Murray et al. discussed in "Synthesis and Characterization of Nearly Monodisperse CdE (E=S, Se, Te) Semiconductor Nanocrystallites," *Journal of the American Chemical Society*, Vol. 115, pp. 8706–8715 (1993), which demonstrates how to obtain cadmium selenide (CdSe) nanocrystals that are extremely uniform in terms of their size, shape, structure, surface passivation and composition. With this method one can easily prepare CdSe particles with any desired size between 1.2 and 11.5 nm with size distributions less than 5% (rms deviation). This approach is of general use and has been extended to other materials, such as zinc selenide (ZnSe), for example. See M. Hines et al., "Bright UV-Blue Luminescent Colloidal ZnSe Nanocrystals," *Journal of Physical Chemistry B*, Vol. 102, No. 19, pp. 3655–3657 (1998). This broader class of high-quality semiconductor nanocrystals is referred to herein as nanocrystals made by the "organometallic approach". Since colloidal semiconductor nanocrystals made by the organometallic approach can be highly fluorescent and robust to repeated excitation by light, application of these materials includes use as laser materials as disclosed in U.S. Pat. No. 5,260,957 to Hakimi et al., and as a fluorescent tag (or marker) in biological applications such as biological assaying as disclosed in U.S. Pat. No. 5,990,479 to Weiss et al.

The interesting properties of these materials have encouraged researchers to go beyond pure nanocrystals and to investigate crystallites that are intentionally doped with impurities; that is, nanocrystals in which a small number of the atoms have been intentionally replaced by another element. This is motivated, in part, by the fact that most of the interesting properties of bulk semiconductor materials result from dopants. In the research of doped nanocrystals, much effort has focused on II–VI semiconductor nanocrystals, such as ZnS or CdS, which are doped with manganese (Mn). See, e.g., R. Bhargava et al., "Optical Properties of Manganese-Doped Nanocrystals of ZnS," *Physical Review Letters*, Vol. 72, No. 3, pp. 416–419 (1994); D. Gallagher et al., "Homogeneous Precipitation of Doped Zinc Sulfide Nanocrystals for Photonic Applications," *Journal of Materials Research*, Vol. 10, No. 4, pp. 870–876 (1995). Initially, this choice was driven by the analogous bulk materials (i.e. bulk semiconductor crystals doped with Mn impurities), referred to as dilute magnetic semiconductors (DMS) or semimagnetic semiconductors. Due to the sp-d exchange interaction between the semiconductor and the Mn, bulk DMS crystals have interesting magnetic and magneto-optical properties. See J. Furdyna, "Diluted Magnetic Semiconductors," *Journal of Applied Physics*, Vol. 64, No. 4, pp. R29–R64, (1988). DMS nanocrystals should exhibit even more exotic behavior since spin—spin exchange interactions are enhanced by the confinement of the electron and hole. However, more recently, an additional motivation has been recognized. DMS nanocrystals have potential applications in "spintronics", electronic devices where not only the charge of the electron, but also its spin, is utilized. See D. Awschalom et al., "Electron Spin and Optical Coherence in Semiconductors," *Physics Today*, Vol. 52, pp. 33–38 (Jun. 1999).

In the prior art, Mn-doped ZnS nanocrystals and a method for preparing same have been discussed, as disclosed in U.S. Pat. No. 6,048,616 to Gallagher et al. (hereinafter "the '616 patent"). However, this prior invention, which does not use the organometallic approach, yields nanocrystals that are not of high quality (i.e. they are not uniform in size, shape, and structure). In addition, the method of this prior invention is to prepare the nanocrystals at room temperature, an approach that is known to produce many defects in the nanocrystals. These nonuniformities and defects limit the usefulness of the nanocrystals. For example, deviations in the size of the particles will make their properties highly inhomogeneous. In the ideal doped sample, all the nanocrystals would be exactly the same and their properties would be identical. If one could obtain Mn-doped nanocrystals with a method similar to the organometallic approach, these particles would have much better properties than those of the '616 patent, for example.

Furthermore, undoped nanocrystals made by the organometallic approach can be induced to form close-packed solids, in which the nanocrystals are in contact but have not fused. See C. Murray et al., "Self-Organization of CdSe Nanocrystallites into Three-Dimensional Quantum Dot Superlattices", *Science, Vol.* 270, pp. 1335–1338 (1995). Close-packed nanocrystals, referred to as "quantum-dot solids," are novel artificial materials in which both the properties of the individual nanocrystalline building block and the interaction between them can be controlled. In these materials, the behavior of the solid can be tailored to fit a specific need.

If Mn-doped nanocrystals could be obtained with a method similar to the organometallic approach, new quantum-dot solids could be fabricated wherein each of the nanocrystalline building blocks has additional properties due to the impurity. However, due to the poor quality of Mn-doped ZnS particles such as those obtained by the method of the '616 patent, such quantum dot solids have not been made in the prior art.

Therefore, to obtain high-quality Mn-doped semiconductor nanocrystals, it would be useful to devise a new method, based upon the general organometallic approach, that could incorporate Mn into the nanocrystal. To date, only one attempt has been reported in the prior art. See F. Mikulec et al., "Organometallic Synthesis and Spectroscopic Characterization of Manganese-Doped CdSe Nanocrystals," *Journal of the American Chemical Society*, Vol. 122, pp. 2532–2540 (2000). However, this work, which describes an extensive multi-year effort to synthesize Mn-doped CdSe nanocrystals, concludes that the Mn is not incorporated inside the nanocrystal, but rather tends to attach to the surface of the nanocrystal. Since many of the properties and applications of Mn-doped nanocrystals depend on the Mn impurity being inside the nanocrystal, this work has not succeeded in preparing useful Mn-doped semiconductor nanocrystals. Indeed, the lack of success of such an extensive effort has indicated thus far that the general organometallic approach may not be useful for Mn-doping.

Accordingly, a need exists to provide a method for producing Mn-doped nanocrystals which incorporates the organometallic approach, incorporates the Mn inside the nanocrystal, and thereby provides nanocrystals which are more uniform in size, shape, surface passivation, composition and crystallinity than in the prior art, and in which the size of the nanocrystals and the concentration of the impurities can easily and desirably be controlled.

SUMMARY OF THE INVENTION

Generally speaking, in accordance with the invention, a method for manufacturing high-quality Mn-doped nanocrystals is provided. The method generally comprises the steps of: (a) combining an organometallic manganese precursor with an organometallic Group II precursor and an organometallic Group VI precursor to provide a precursor mixture; (b) diluting the precursor mixture with a dilution solvent to provide an injection mixture; (c) heating a coordinating solvent; (d) stirring the heated coordinating solvent; and (e) injecting the injection mixture into the heated coordinating solvent while the heated coordinating solvent is being stirred.

Nanocrystals obtained by the method of the present invention are much more uniform in size, shape, and crystallinity than in the prior art. The size of the nanocrystals and the concentration of the impurities can also be easily controlled. Furthermore, these particles are highly luminescent. For example, by exciting ZnSe nanocrystals manufactured in accordance with the present invention with light (e.g. with a galium nitride (GaN) laser at wavelengths less than ~410 nm or a frequency-tripled Nd:YAG laser at ~355 nm), very efficient emission is obtained from the Mn impurity. Since this emission (at 585 nm) is strongly red-shifted from the excitation wavelength, the nanocrystals produced by the present invention are particularly useful in biological assaying.

In a preferred embodiment of the invention, high-quality, Mn-doped ZnSe nanocrystals are prepared. In another embodiment, high-quality, Mn-doped zinc sulfide (ZnS) nanocrystals are prepared. In a further embodiment, high-quality, Mn-doped zinc telluride (ZnTe) nanocrystals are prepared.

DETAILED DESCRIPTION OF THE PREFERRED EMBODIMENTS

Figure 1:
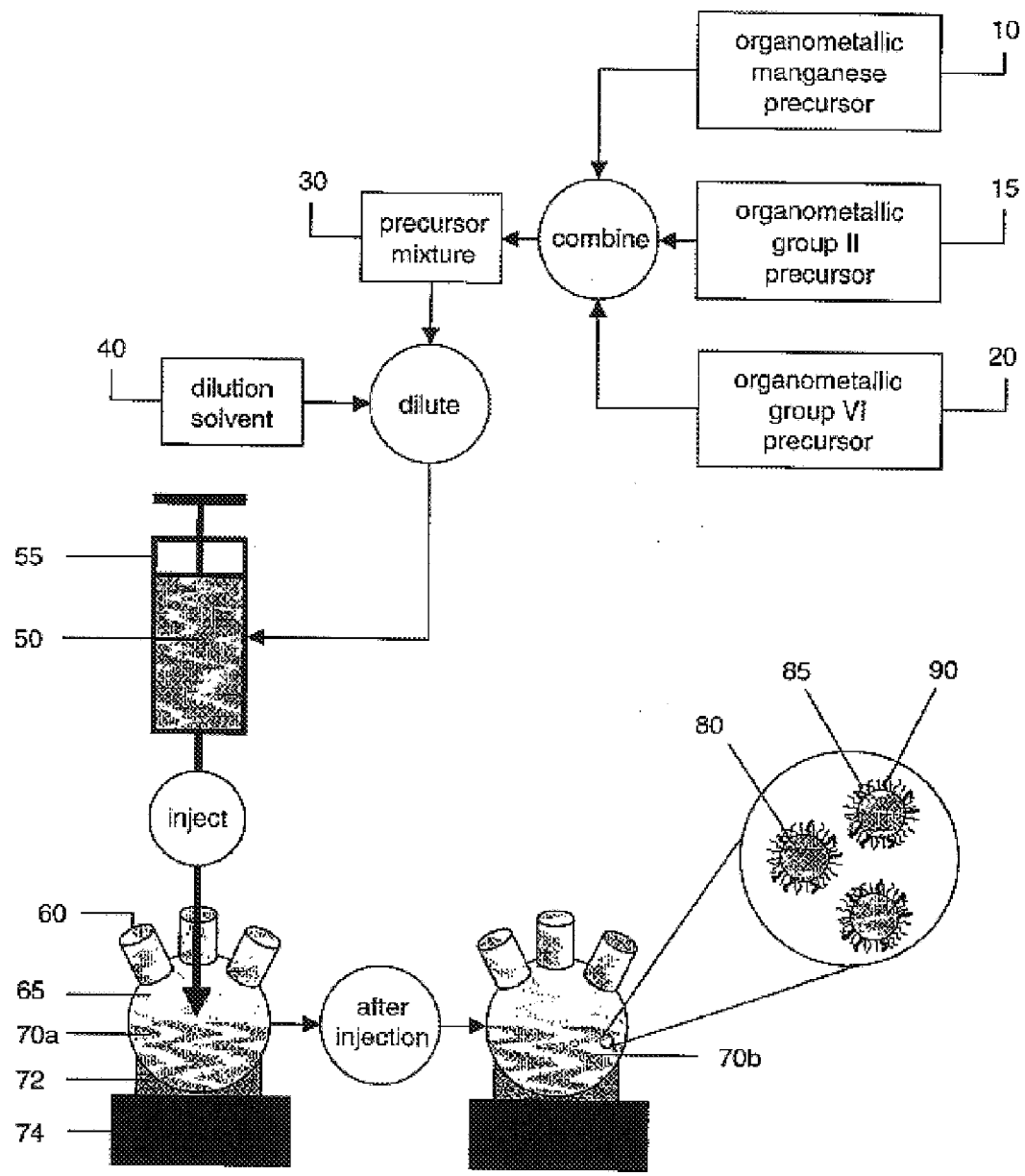
FIG. 1 is a flow chart illustrating the general method of the present invention.

As noted above, the organometallic approach is useful to prepare high-quality nanocrystals. In general, the organometallic approach requires suitable organometallic precursors for the constituent elements in the material of interest. For example, to make undoped ZnSe, diethylzinc and trioctylphosphine selenide are suitable precursors. These precursors are then rapidly added to a pot of hot coordinating solvent. ("Coordinating solvent" refers to a chemical that has sufficient affinity to the nanocrystalline material that it will bind to the surface of the nanocrystal as it grows. This "surface cap" or "surface passivation" prevents agglomeration of the particles. On the other hand, the solvent cannot bind too strongly to the surface of the nanocrystal or it will prevent new material from being added to the growing particle.) Once the precursors are mixed with the hot solvent, the precursor molecules pyrolize (or decompose) and small crystals of semiconductor (e.g. ZnSe) nucleate. Growth of these "seed" particles occurs during prolonged heating (generally on the order of hours to days) of the growth solution. Once the nanocrystals are of the desired size, the heat is removed, and the particles are isolated from the growth solution.

It is important to note that one of the reasons that the organometallic approach yields such high-quality nanocrystals is that the reaction is carried out at relatively high temperatures (typically >300° C.). This is much higher than many other approaches to nanocrystal synthesis, in which the particles are made at room temperature. The high temperature of the organometallic approach provides sufficient thermal energy to "anneal out" crystalline defects. Thus, the nanocrystals are highly crystalline with few stacking faults, dislocations, surface defects, etc. This has dramatic implications for many of the properties of these materials, such as fluorescence.

To create Mn-doped nanocrystals, it is not obvious how the organometallic approach can be used to make high-quality particles. First, a suitable organometallic precursor for Mn must be found which is compatible with the other chemicals used in the reaction (in particular, both the other precursors and the coordinating solvent). More importantly, this precursor for Mn and the doping process must be compatible with the high temperature of the reaction and subsequent growth. In the method of the '616 patent, discussed above, the reaction was carried out using diethylmanganese as the Mn precursor. This precursor was successful at doping the nanocrystals. However, the method of the '616 patent does not follow the organometallic approach. Instead, the nanocrystals are prepared at room temperature. As a result, the nanocrystals are Mn-doped, but of low quality due to defects that are not annealed out of the crystal.

Indeed, since it is possible to consider the Mn impurity as a "defect" in the nanocrystal, one possibility is that the high temperature required by the organometallic approach will be incompatible with doping, since the thermal energy can also "anneal" out the "defect" caused by the dopant. The dopant atom can thus be "pushed" out of the nanocrystal. In bulk semiconductor crystals, this is typically not a concern, because the impurity is always extremely far (many lattice constants) from the crystal boundary. In the nanocrystal, however, the impurity is always only a few lattice constants from the surface of the particle and Mn could easily diffuse out of the nanocrystal at high temperature. In fact, since the extensive work by F. Mikulec et al., supra, in which it was found that Mn impurities segregate to the surface of CdSe nanocrystals when the organometallic approach was used, it has been commonly believed by those knowledgeable in the art that the high growth temperature required for high-quality nanocrystals is incompatible with impurity doping.

However, the inventor herein has demonstrated that, using an appropriate method such as that of the present invention, this is not correct. Instead, the inability of the methods of F. Mikulec et al. to form doped nanocrystals was due to either these particular methods or to the peculiar properties of CdSe. The novel method described herein utilizes the general organometallic approach to prepare high-quality, Mn-doped nanocrystals at high temperature. The method of the present invention has been found to be not susceptible to the problems encountered by the prior art. Instead, the Mn impurities are embedded inside the nanocrystals, as desired. Furthermore, unlike the '616 patent, the particles produced by the present invention are highly uniform in size, shape, surface passivation, composition and crystal structure. They have low defect densities and are highly luminescent.

The method of the present invention preferably uses dimethylmanganese (and not diethylmanganese as in the '616 patent) as the organometallic precursor. While both dialkylmanganese species are metastable, the lifetime of dimethylmanganese is significantly longer. See M. Tamura et al., "Elimination and Catalytic Decomposition of Dialkylmanganese Species," *Journal of Organometallic Chemistry*, Vol. 29, pp. 111–129 (1971). The increased stability of dimethylmanganese is believed to be important for the success of the high temperature reaction. Furthermore, this Mn precursor is found to be compatible with the rest of the reaction.

Referring now to the figures, FIG. 1 is a flowchart illustrating the general method of the present invention. An organometallic manganese precursor 10 is combined with an organometallic Group II precursor 15 and an organometallic Group VI precursor 20 to provide a precursor mixture 30. The precursor mixture 30 is then diluted with a dilution solvent 40 to form an injection mixture 50. The dilution is performed so as to control the number and size of the nanocrystals as desired (see Murray et al., *Journal of the American Chemical Society*, supra). Separately, a container 60, such as a flask, containing a coordinating solvent 70a is degassed, refilled with an inert gas 65 (such as argon, although other inert gases may be used) and heated. The coordinating solvent is preferably heated to a temperature sufficient to at least substantially eliminate defects (such as poor surface passivation or dislocations or stacking faults in the crystalline structure of the nanocrystal) in nanocrystals produced after the injection mixture is injected into the heated coordinating solvent. Suitable temperatures for this purpose are generally above 200° C., and preferably above 300° C., although the lower limit of the temperature required depends on the temperature required to anneal (that is, substantially eliminate) defects from the nanocrystal for the specific semiconductor used. This heating is preferably accomplished using a variable heat source 72. The coordinating solvent 70a is then rapidly stirred, preferably using a stirrer 74, while the injection mixture 50 is quickly injected into the coordinating solvent 70a in the container 60, preferably by using a syringe 55, to create a reaction mixture 70b. High-quality Group II–VI semiconductor nanocrystals 80 are thereby obtained with surfaces that are passivated with the coordinating solvent 90 and the dilution solvent 95 if the dilution solvent is coordinating (the dilution solvent may or may not be coordinating, which can be selected based on the particular dilution solvent used). It should be noted that since many of the molecules typically used in this method are air-sensitive, standard practices for performing air-sensitive chemistry are preferably used (see Murray et al., *Journal of the American Chemical Society*, supra).

Suitable materials for use as an organometallic manganese precursor include dimethylmanganese, $Mn(CO)_5Me$, $[MnTe(CO)_3(PEt_3)_2]_2$, and $Mn_2(\mu-SeMe)_2(CO)_8$. Suitable materials for use as an organometallic Group II precursor include dialkylzinc (such as diethylzinc), dialkylcadmium (such as dimethylcadmium) and dialkylmercury (such as dibenzylmercury). Suitable materials for use as an organometallic Group VI precursor include trialkylphosphine selenide (such as trioctylphosphine selenide), [bis(trimethylsilyl)sulfide] and trialkylphosphine telluride (such as trioctylphosphine telluride). Suitable materials for use as a dilution solvent include trialkylphosphine (such as trioctylphosphine and tributylphosphine). Hexadecylamine is preferably used as the coordinating solvent, although other suitable coordinating solvents may be employed. It should be noted that the preceding list of materials is not exclusive or exhaustive, but rather is exemplary, and other suitable materials may be utilized in accordance with the invention.

Additional, optional steps which may be pursued in conjunction with the above-described method include (as generally known in the art): (a) prolonged heating of the reaction mixture 70b at temperatures above 250° C. to increase the size of the nanocrystals; (b) preparation of a specific size of nanocrystal by removal of this heat when a desired size (as determined by absorption spectroscopy) is obtained; (c) isolation of the nanocrystals from reaction mixture by precipitation; (d) further improvement of the size distribution of the nanocrystals by size-selective precipitation; (e) dispersal of the nanocrystals into a variety of host materials (such as organic solvents, polymers or even other semiconductors; and (f) coating of the nanocrystal surface with another material to change its properties in some desirable way. Moreover, while ZnSe nanocrystals are produced in the preceding example, the invention encompasses high quality Mn-doped nanocrystals of other materials, such as ZnS and other Group II–VI semiconductors and their alloys such as ZnTe, mercury chalcogenides, and the like, depending on the precursors used.

Figure 2:
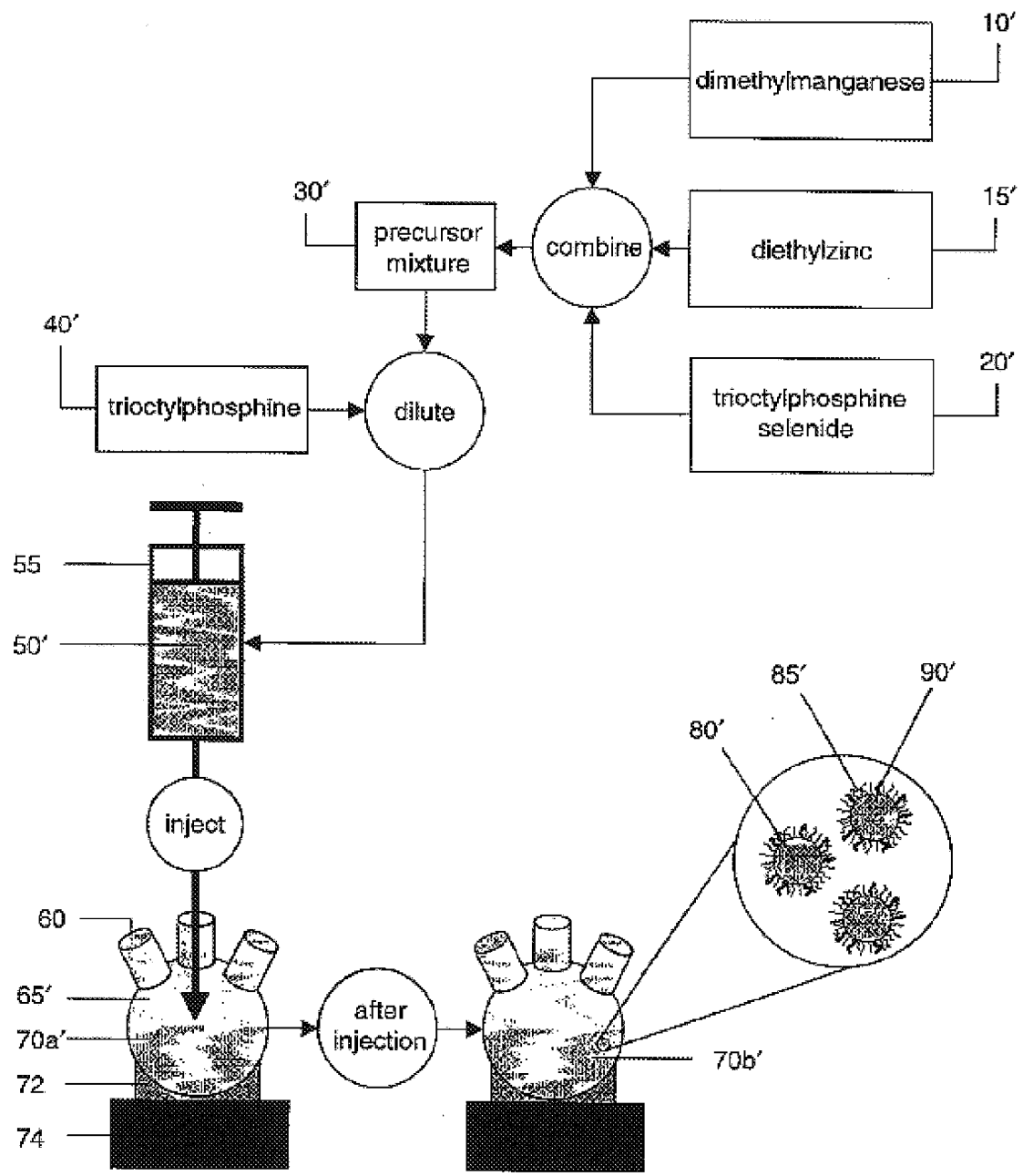
FIG. 2 is a flow chart illustrating a specific embodiment of the method of the present invention.

FIG. 2 is a flowchart illustrating one of many possible specific embodiments of the method of the present invention, in which particular materials are specified. This embodiment follows the general method illustrated in FIG. 1. Dimethylmanganese 10' is used as the organometallic manganese precursor, and is freshly prepared by combining MnCl$_2$ with methylmagnesium chloride, both in tetrahydrofuran (THF). The dimethylmanganese is then combined with diethylzinc 15' and trioctylphosphine selenide 20', which act as the organometallic Group II precursor and the organometallic Group VI precursor, respectively, to provide precursor mixture 30'. The precursor mixture 30' is then diluted with trioctylphosphine 40' as the dilution solvent to form injection mixture 50'. Separately, a flask 60 containing hexadecylamine 70a' as the coordinating solvent is degassed, refilled with argon 65' and heated to a temperature above 300° C. using variable heat source 72. Using stirrer 74, the hexadecylamine 70a' is then rapidly stirred while the injection mixture 50' is quickly injected with syringe 55 into the hexadecylamine 70a' in the flask 60 to create reaction mixture 70b'. ZnSe nanocrystals 80' are thereby obtained that are passivated with hexadecylamine 90' and trioctylphosphine 95' molecules. Data suggests that roughly 1–10% of the Mn, initially introduced as dimethylmanganese, is actually incorporated into the nanocrystals. As referenced below, the samples are designated by their initial Mn:Zn (i.e. the ratio of dimethylmanganese to diethylzinc) concentration in atomic percent, $C_I$.

Figure 3:
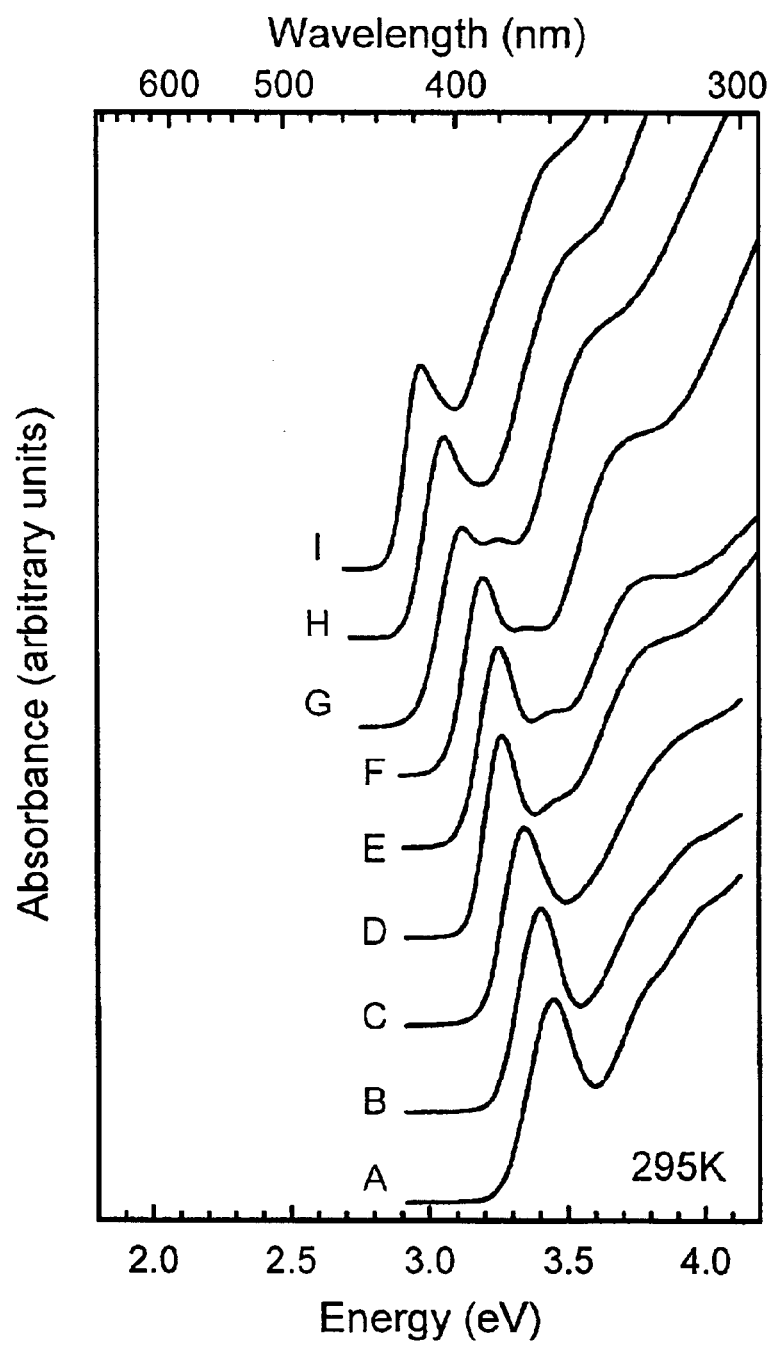
FIG. 3 is a chart showing a series of absorption spectra for different-sized ZnSe nanocrystals (both doped and undoped) manufactured by the method of the present invention.

FIG. 3 shows room temperature absorption spectra for a series of samples of ZnSe nanocrystals (both doped and undoped) labeled A through I. The mean diameters (D) and initial Mn concentrations ($C_I$) are: (A) <2.7 nm and 0%; (B) <2.7 nm and 0%; (C) 2.7 nm and 0%; (D) 2.75 nm and 0.5%; (E) 2.8 nm and 0%; (F) 3.05 nm and 0%; (G) 3.6 nm and 2.5%; (H) 4.3 nm and 2.5%; and (I) 5.75 nm and 2.5%. The sizes are estimated from the first absorption maxima by using previous TEM measurements on undoped ZnSe nanocrystals. Due to the quantum size effect, a series of electronic transitions appear, which are shifted to higher energy than the bulk band gap (2.58 eV). To one of ordinary skill in the art, the quality of the particles is demonstrated by the number of excited electronic states that are resolved in these spectra. Such spectra were acquired after size-selective precipitation (see Murray et al., *Journal of the American Chemical Society*, supra) was used to further narrow the size distribution. The spectra appear strikingly similar (at least qualitatively) to the best CdSe spectra. Measurements of the size distribution by transmission electron microscopy (TEM) suggest that the standard deviation in size is <6%. (However, due to measurement error caused by low Z-contrast in ZnSe, this value is only an upper bound.) Thus, the size distribution of these doped nanocrystals is comparable to the best undoped CdSe nanocrystals.

In contrast to the shortcomings in the prior art with incorporating Mn into nanocrystals, Mn is confirmed to be embedded inside the nanocrystals in the present invention. These results will now be described in detail.

Figure 4:
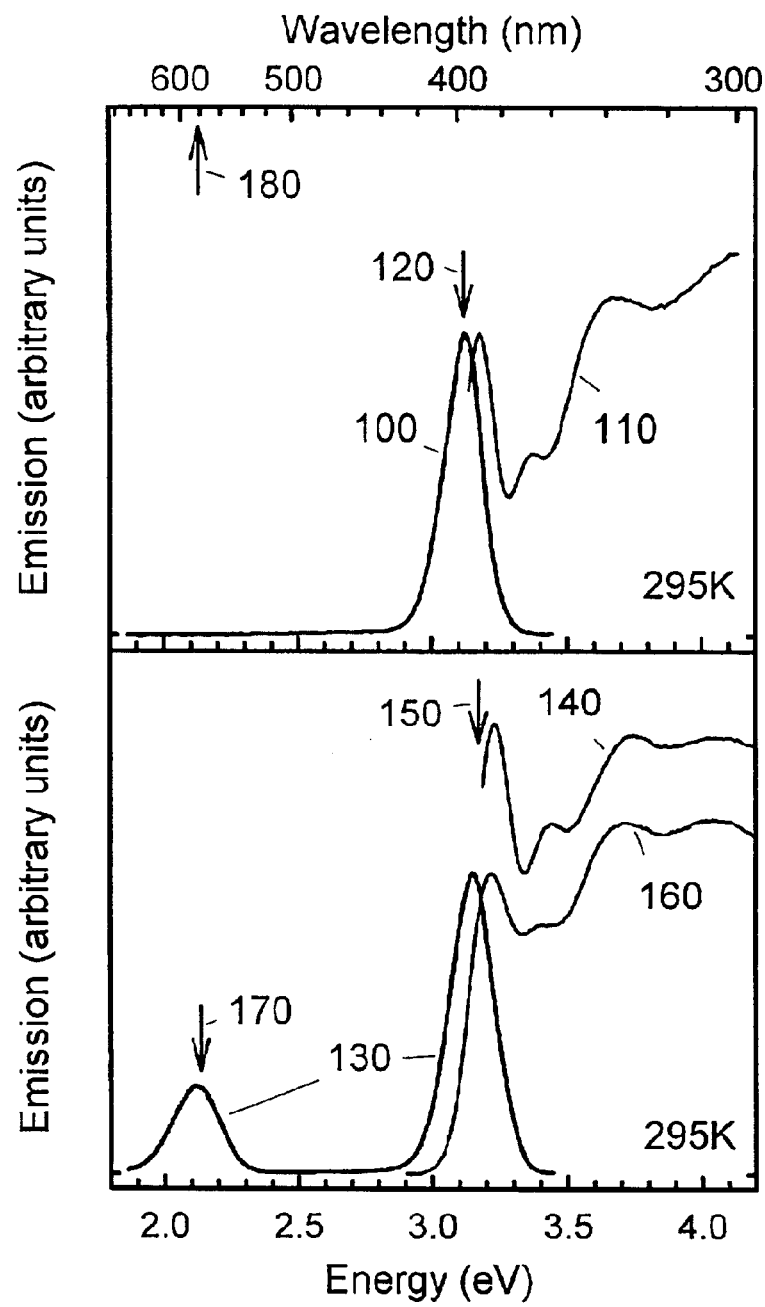
FIG. 4 is a chart showing the emission that occurs when the ZnSe nanocrystals are excited by blue light for both undoped nanocrystals (top graph) and for nanocrystals doped by the method of the present invention (bottom graph)

The first evidence indicating successful doping was obtained from luminescence results as shown in FIG. 4. FIG. 4 provides a comparison of undoped and Mn-doped nanocrystals, including a top graph corresponding to an undoped ZnSe nanocrystal sample, and a bottom graph corresponding to a Mn-doped ZnSe nanocrystals sample. Unlike many nanocrystal systems that do not emit at all or emit weakly from red-shifted trap states, the ZnSe nanocrystals utilized in the present invention exhibit efficient emission. A photoluminescence spectrum 100 for an undoped sample (sample F in FIG. 3) made by the method of the present invention shows a strong blue emission feature. Since defects in the nanocrystals strongly decrease the intensity of the blue emission, this feature is indicative of the quality of the nanocrystals. Furthermore, it should be noted that no red-shifted emission (due to "trap-states" or defects) is present in the photoluminescence spectrum 100 of the undoped nanocrystals. A photoluminescence excitation (PLE) spectrum 110 for the same sample is obtained by monitoring a narrow spectral band (marked by arrow 120) of the blue emission while scanning the excitation energy. In general, PLE spectra indicates what color light, once absorbed, leads to the monitored emission. They are similar to absorption spectra, with the additional requirement that the absorbed light must lead to emission at the monitored energy. In the resulting spectrum 110, a series of ZnSe absorption features are observed, consistent with the absorption spectrum in FIG. 3. The similarity between the absorption spectrum (F in FIG. 3) and the PLE spectrum (110 in FIG. 4) is another indication of the quality of nanocrystals obtained by this method.

Figure 5:
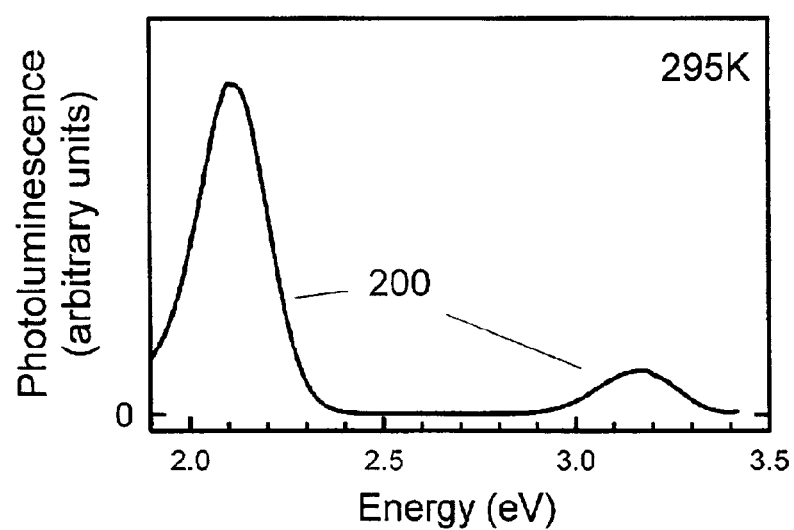
FIG. 5 is a chart showing the photoluminescence of Mn-doped ZnSe nanocrystals with a higher Mn concentration than in the bottom graph of FIG. 3.

The above spectra of undoped nanocrystals are shown for comparison with results obtained for Mn-doped samples. This comparison yields information about the success of the doping process. A photoluminescence spectrum 130 of a Mn-doped sample ($C_I$=3.1% and a mean diameter of 2.85 nm) shows an additional broad red emission feature with a maximum at 2.12 eV (585 nm). Photoluminescence excitation may then be used to probe which absorption features lead to this red emission. A comparison of a photoluminescence excitation spectrum 140 obtained by monitoring the blue emission (arrow 150) with a spectrum 160 obtained by monitoring the red emission (arrow 170) shows that the same absorption features are responsible for both. Since similar red emission is observed in Mn-doped ZnSe bulk crystals at 2.13 eV (arrow 180) and is assigned to an internal Mn transition ($^4T_1$-$^6A_1$), the 2.12 eV line is consistent with emission from Mn impurities in ZnSe. Furthermore, the similarity of the photoluminescence excitation results 140 and 160 indicate that the Mn emission is caused by energy transfer from the excited ZnSe nanocrystals to the Mn impurity. In summary, in the absence of the impurity, the ZnSe nanocrystals fluoresce strongly in the blue. To one of ordinary skill in the art, this strong luminescence indicates the quality of these particles. Once Mn is added to the nanocrystal, the fluorescence is efficiently emitted from the Mn impurity. This is strong evidence that Mn is embedded inside the nanocrystals. The efficiency of this energy transfer depends on the Mn concentration. FIG. 5 shows a photoluminescence spectrum 200 for a sample with mean diameter of 2.85 nm and $C_I$=6.3%. The Mn emission has increased dramatically in intensity, when compared with the spectrum of Mn-doped nanocrystals with $C_I$=3.1% (130 in FIG. 4). In fact, the Mn emission quantum yield has been measured to be as high as 22% at room temperature and 75% at temperatures less than 50 K. (These values are relative to stilbene 420 laser dye obtained from Exciton, Inc.) Thus, the energy transfer from the ZnSe to the Mn impurity is extremely efficient in these samples. This strength of Mn emission indicates that when the nanocrystal is excited by light it quickly transfers this energy to the Mn impurity. However, while evidence of energy transfer is compelling data in favor of successful doping, it is does not guarantee that Mn has substituted for Zn in the nanocrystal. Energy transfer could potentially occur if Mn were on the surface of the nanocrystal or very closely positioned in the material around the nanocrystal. Thus, to test this possibility, several additional experiments were performed to confirm that Mn is inside the nanocrystal.

First, repeated surface-cap exchanges with pyridine, which can remove Mn from the surface of CdSe nanocrystals (see F. V. Mikulec et al., supra), did not alter any of the above optical results. When pyridine-capped ZnSe nanocrystals were redispersed in hexane with a small amount of trioctylphosphine and trioctylphosphine oxide, the strong Mn emission returned. Energy dispersive X-ray results also detected a small Mn signal even after repeated (>6) surface-cap exchanges.

Figure 6:
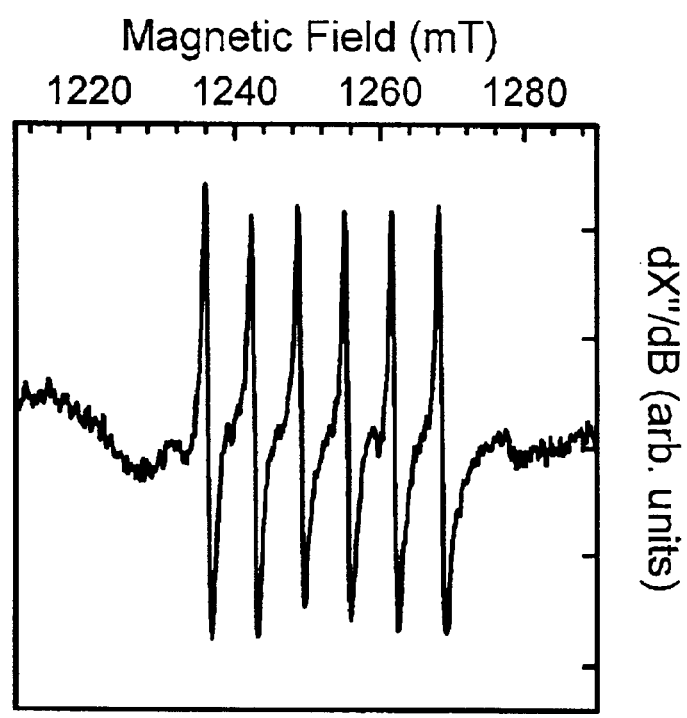
FIG. 6 is a chart showing the electron paramagnetic resonance (EPR) spectrum for a Mn-doped ZnSe nanocrystalline sample prepared according to the present invention, confirming that Mn is embedded inside the nanocrystals.

Secondly, electron paramagnetic resonance (EPR) experiments (at room temperature and 35 GHz) performed on the samples are consistent with Mn embedded inside the nanocrystal. Six-line spectra were obtained, as shown in FIG. 6, which arise due to the hyperfine interaction with the $^{55}$Mn nucleus (I=5/2). Since the hyperfine splitting is strongly dependent on the local environment, EPR spectra can be used to determine the location of the Mn. From FIG. 6, a hyperfine splitting of $60.4 \times 10^{-4}$ cm$^{-1}$ is extracted. This value agrees well with that obtained for Mn at cubic lattice sites in bulk ZnSe ($61.7 \times 10^{-4}$ cm$^{-1}$). Thus, it is concluded that the majority of the Mn is substituted for Zn in the nanocrystal. Although signal from lower symmetry sites (e.g. at or near the surface) is also present in the samples, it is much smaller. In contrast, the EPR spectra from many previous prior art samples were dominated by these lower symmetry signals. In fact, it was this observation that initially suggested that doping of CdSe with Mn was problematic.

Figure 7:
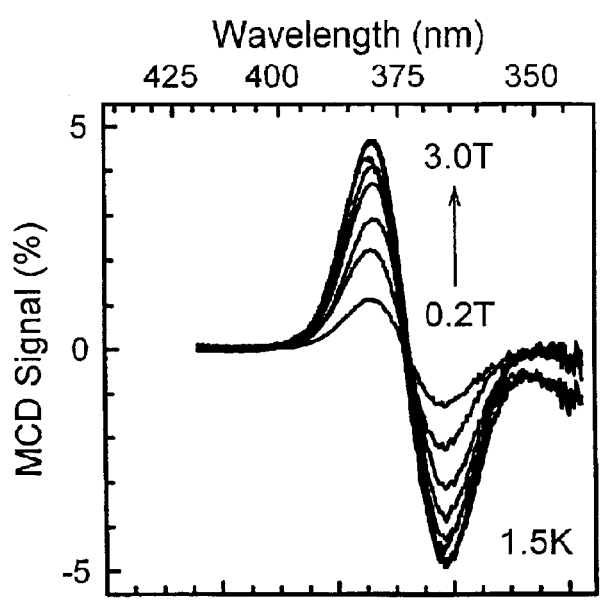
FIG. 7 is a chart showing the magnetic circular dichroism (MCD) spectrum for a Mn-doped ZnSe nanocrystalline sample prepared according to the present invention, confirming that Mn is embedded inside the nanocrystals.
Figure 8:
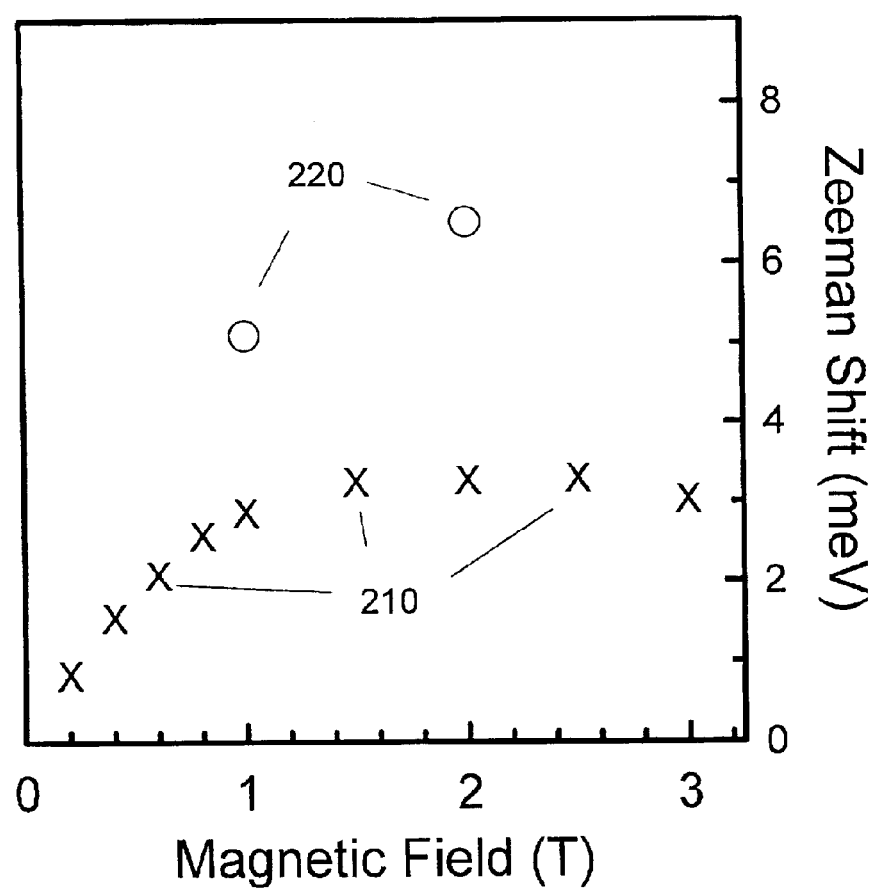
FIG. 8 is a chart showing the Zeeman shift extracted from MCD data on doped ZnSe nanocrystalline samples prepared according to the present invention, in which the size of the shift confirms that Mn is embedded inside the nanocrystals.

Third, magnetic circular dichroism (MCD) results (as in FIG. 7) were obtained on the samples that can only be explained by internal Mn. MCD measures the difference between the absorbance (A) for left circularly polarized (LCP) and right circularly polarized (RCP) light in the presence of an external magnetic field. If the first excited state of the nanocrystal is considered, the applied field will induce a Zeeman splitting ($\Delta$Ez) such that the absorption spectra of LCP and RCP are slightly displaced in energy. Consequently, to good approximation, the MCD signal near the first absorption feature of the nanocrystals is the derivative of the first excited-state lineshape. The magnitude of the signal is determined by the size of $\Delta$Ez. Thus, MCD experiments have been used on undoped nanocrystals to obtain information about their spin sublevels, such as the effective g-factor ($g_{eff}$) of the electron-hole pair. See M. Kuno et al., "Magnetic Circular Dichroism Study of CdSe Quantum Dots," *Journal of Chemical Physics*, Vol. 108, No. 10, pp. 4242–4247 (1998). Of course, these sublevels should be strongly affected by the presence of a Mn impurity. However, since this effect requires wavefunction overlap between the confined electron-hole pair and the impurity, it appears strongly only for internal Mn. In FIG. 7, MCD spectra are shown for a sample with a mean diameter of 2.9 nm and $C_I=1.0\%$. As the external magnetic field is increased from 0.2 to 3.0 Tesla, the MCD signal, plotted as $(A_{LCP}-A_{RCP})/A$ in percent, also increases. By fitting such MCD results, the field dependence of the Zeeman shift is extracted for two samples as shown in FIG. 8. A first sample 210 has a mean diameter of 2.9 nm and $C_I=1.0\%$. A second sample 220 has a mean diameter of 4.2 nm and $C_I=2.5\%$. While undoped samples show a small Zeeman shift ($g_{eff}\sim 1$, $\Delta$Ez$\sim$0.100 meV at 2T for CdSe) that increases linearly with fields up to 10T, the Mn-doped samples show a much larger shift (as large as 6.5 meV at 2T) that depends on doping concentration and saturates at modest fields. Indeed, in the small field limit, the samples have shown an effective g-factor that is nearly 100 times larger than that observed in undoped CdSe.

These results are in agreement with what is expected for a nanocrystal with internal Mn. The electron-hole pair feels an extremely large effective magnetic field due to the overlap with the Mn spin. This field splits the spin sublevels even in zero applied field. However, since each doped nanocrystal has a Mn ion that is randomly oriented in zero field, this splitting will only result in a broadening of the optical transitions. By applying a small external field, the Mn are partially aligned, and the large Zeeman splitting can be observed in the MCD signal. At higher fields, the Mn become fully aligned, and the effect should saturate, as observed.

To further clarify the method of the present invention for preparing Mn-doped ZnSe nanocrystals, several specific examples will now be described. These examples are for illustrative purposes only, and are not intended to limit the scope of the invention.

EXAMPLE 1

In a typical procedure, and following the general method as described above with respect to FIG. 1, dimethylmanganese is freshly prepared in a helium glove box by reacting 0.5 mL of a 0.2M manganese chloride (MnCl$_2$) slurry in anhydrous tetrahydrofuran (THF) with 0.2 mL of 3M methylmagnesium chloride in THF. (Unless noted, all chemicals were purchased from Sigma-Aldrich Co. and used without purification.) The resulting clear golden solution is then diluted with 1.8 mL of anhydrous toluene. Subsequently, 0.5 mL of this 0.04M dimethylmanganese solution (0.02 mmol) is added to a syringe containing 4 mL of trioctylphosphine ("TOP", FLUKA™), 1 mL of 1M selenium in TOP (ALFA AESAR®), and 82 mL of diethylzinc (Strem Chemicals, Inc., 0.8 mmol). (When selenium metal dissolves in TOP, it forms a complex, trioctylphosphine selenide.) The syringe is removed from the glove box and rapidly injected into a vigorously stirred reaction vessel with 15 mL of distilled HDA at 310° C. under dry nitrogen. Prior to injection, HDA is degassed for several hours at 90° C. under vacuum. The absorption spectrum of a small aliquot, removed immediately after injection, typically reveals an absorption feature around 320 nm, characteristic of small ZnSe nanocrystals. These nanocrystals are then grown at 240–300° C. Once the final desired size is obtained, as monitored by the absorption spectrum, the particles are isolated from the growth solution using standard nanocrystal-separation methods. See Murray et al., *Journal of the American Chemical Society*, supra. The final concentration of Mn is adjusted by changing the amount of dimethylmanganese added to the reaction. Thus, the above procedure allows the preparation of Mn-doped ZnSe nanocrystals with $C_I$ up to 2.5%.

EXAMPLE 2

To prepare nanocrystals with even higher Mn concentrations, the amount of dimethylmanganese in the reaction is increased. One possible method begins by reacting 125 mg (1 mmole) of finely ground MnCl$_2$ powder with 2 ml of 3M methylmagnesium chloride in THF. After the reaction is complete, this mixture is then diluted with 3 ml of toluene. Any unreacted MnCl$_2$ is filtered from the solution to obtain a clear, dark brown, solution. This ~0.2M dimethylmanganese solution is then used as in Example 1 to obtain initial Mn concentrations $C_I$ between ~2.5 and ~12.5%.

EXAMPLE 3

A method, similar to Example 1 or Example 2, wherein the selenium precursor trioctylphosphine selenide, which acts as the organometallic Group VI precursor) is replaced by a sulfur precursor [bis(trimethylsilyl)sulfide], can be used to make high-quality ZnS nanocrystals, or a Tellurium precursor (such as trioctylphosphine telluride) to make high-quality ZnTe nanocrystals.

EXAMPLE 4

A method, similar to Example 1, where freshly prepared dimethylmanganese is not used as the organometallic manganese precursor. Instead, an alternative precursor, such as $Mn(CO)_5Me$, $[MnTe(CO)_3(PEt_3)_2]_2$, or $Mn_2(\mu-SeMe)_2(CO)_8$, is used to introduce Mn to the nanocrystals.

While there have been described and illustrated herein methods for preparing high-quality Mn-doped semiconductor nanocrystals, it will be apparent to those skilled in the art that further variations and modifications are possible without deviating from the broad teachings and spirit of the invention which shall be limited solely by the scope of the claims appended hereto.

What is claimed is:

1. A method for manufacturing high-quality Mn-doped nanocrystals, the method comprising the steps of:
   (a) combining an organometallic manganese precursor with an organometallic Group II precursor and an organometallic Group VI precursor to provide a precursor mixture;
   (b) diluting the precursor mixture with a dilution solvent to provide an injection mixture;
   (c) heating a coordinating solvent;
   (d) stirring the heated coordinating solvent; and
   (e) injecting the injection mixture into the heated coordinating solvent while the heated coordinating solvent is being stirred.

2. The method of claim 1, wherein the organometallic manganese precursor is selected from the group consisting of dimethylmanganese, $Mn(CO)_5Me$, $[MnTe(CO)_3(PEt_3)_2]_2$, and $Mn_2(\mu-SeMe)_2(CO)_8$.

3. The method of claim 1, wherein the organometallic Group II precursor is selected from the group consisting of dialkylzinc, dialkylcadmium and dialkylmercury.

4. The method of claim 1, wherein the organometallic Group II precursor is selected from the group consisting of diethylzinc, dimethylcadmium and dibenzylmercury.

5. The method of claim 1, wherein the organometallic Group VI precursor is selected from the group consisting of trialkylphosphine selenide and trialkylphosphine telluride.

6. The method of claim 1, wherein the organometallic Group VI precursor is selected from the group consisting of trioctylphosphine selenide, [bis(trimethylsilyl)sulfide] and trioctylphosphine telluride.

7. The method of claim 1, wherein the dilution solvent is trialkylphosphine.

8. The method of claim 1, wherein the dilution solvent is selected from the group consisting of trioctylphosphine and tributylphosphine.

9. The method of claim 1, wherein the coordinating solvent is hexadecylamine.

10. The method of claim 1, wherein the coordinating solvent is heated in step (c) to a temperature that is sufficient to at least substantially eliminate defects in nanocrystals produced after the injection mixture is injected into the heated coordinating solvent.

11. The method of claim 1, wherein the coordinating solvent is heated in step (c) to a temperature of at least 200° C.

12. The method of claim 1, wherein the coordinating solvent is heated in step (c) to a temperature of at least 300° C.

13. The method of claim 1, further comprising the step of combining $MnCl_2$ in tetrahydrofuran with methylmagnesium chloride in tetrahydrofuran to provide dimethylmanganese as the organometallic manganese precursor for step (a).

14. The method of claim 1, wherein the step (e) of injecting the injection mixture into the heated coordinating solvent while the heated coordinating solvent is being stirred provides a reaction mixture, the method further comprising the step of:
   (f) heating the reaction mixture at a temperature of at least 250° C. such that the size of the nanocrystals increases.

15. The method of claim 14, further comprising the step of:
   (g) removing the heat applied in step (f) from the reaction mixture such that nanocrystals of a predetermined size are provided.

16. The method of claim 1, wherein the step (e) of injecting the injection mixture into the heated coordinating solvent while the heated coordinating solvent is being stirred provides a reaction mixture, the method further comprising the step of:
   (f) isolating the nanocrystals from the reaction mixture by precipitation.

17. The method of claim 1, wherein the step (e) of injecting the injection mixture into the heated coordinating solvent while the heated coordinating solvent is being stirred provides a reaction mixture, the method further comprising the step of:
   (f) isolating the nanocrystals from the reaction mixture by size-selective precipitation such that the size distribution of the nanocrystals is improved.

18. The method of claim 1, further comprising the step of:
   (f) dispersing the nanocrystals into a host material.

19. The method of claim 1, further comprising the step of:
   (f) coating the surface of the nanocrystals with a material such that properties of the nanocrystals are altered.

20. High-quality Mn-doped nanocrystals manufactured according to the method of claim 1.

21. A method for manufacturing high-quality Mn-doped ZnSe nanocrystals, the method comprising the steps of:
   (a) combining dimethylmanganese with diethylzinc and trioctylphosphine selenide to provide a precursor mixture;
   (b) diluting the precursor mixture with trioctylphosphine to provide an injection mixture;
   (c) heating hexadecylamine;
   (d) stirring the heated hexadecylamine; and
   (e) injecting the injection mixture into the heated hexadecylamine while the heated hexadecylamine is being stirred.

22. The method of claim 21, wherein the hexadecylamine is heated in step (c) to a temperature of at least 300° C.

23. The method of claim 21, further comprising the step of combining $MnCl_2$ in tetrahydrofuran with methylmagnesium chloride in tetrahydrofuran to provide the dimethylmanganese for step (a).

24. High-quality Mn-doped ZnSe nanocrystals manufactured according to the method of claim 21.

25. A method for manufacturing high-quality Mn-doped ZnS nanocrystals, the method comprising the steps of:
   (a) combining dimethylmanganese with diethylzinc and [bis(trimethylsilyl)sulfide] to provide a precursor mixture;
   (b) diluting the precursor mixture with trioctylphosphine to provide an injection mixture;
   (c) heating hexadecylamine;

(d) stirring the heated hexadecylamine; and (e) injecting the injection mixture into the heated hexadecylamine while the heated hexadecylamine is being stirred.

26. The method of claim 25, wherein the hexadecylamine is heated in step (c) to a temperature of at least 300° C.

27. The method of claim 25, further comprising the step of combining $MnCl_2$ in tetrahydrofuran with methylmagnesium chloride in tetrahydrofuran to provide the dimethylmanganese for step (a).

28. High-quality Mn-doped ZnS nanocrystals manufactured according to the method of claim 25.

29. A method for manufacturing high-quality Mn-doped ZnTe nanocrystals, the method comprising the steps of:

(a) combining dimethylmanganese with diethylzinc and trioctylphosphine telluride to provide a precursor mixture;

(b) diluting the precursor mixture with trioctylphosphine to provide an injection mixture;

(c) heating hexadecylamine;

(d) stirring the heated hexadecylamine; and (e) injecting the injection mixture into the heated hexadecylamine while the heated hexadecylamine is being stirred.

30. The method of claim 29, wherein the hexadecylamine is heated in step (c) to a temperature of at least 300° C.

31. The method of claim 29, further comprising the step of combining $MnCl_2$ in tetrahydrofuran with methylmagnesium chloride in tetrahydrofuran to provide the dimethylmanganese for step (a).

32. High-quality Mn-doped ZnTe nanocrystals manufactured according to the method of claim 29.

* * * * *